(12) United States Patent
Oi et al.

(10) Patent No.: US 7,154,106 B2
(45) Date of Patent: Dec. 26, 2006

(54) COMPOSITE SYSTEM OF SCANNING ELECTRON MICROSCOPE AND FOCUSED ION BEAM

(75) Inventors: Masamichi Oi, Chiba (JP); Takashi Ogawa, Chiba (JP)

(73) Assignee: SII NanoTechnology Inc. (JP)

( * ) Notice: Subject to any disclaimer, the term of this patent is extended or adjusted under 35 U.S.C. 154(b) by 123 days.

(21) Appl. No.: 11/058,945

(22) Filed: Feb. 16, 2005

(65) Prior Publication Data
US 2005/0184251 A1    Aug. 25, 2005

(30) Foreign Application Priority Data
Feb. 24, 2004    (JP)    ............................. 2004-047933

(51) Int. Cl.
*H01L 21/66* (2006.01)
*H01L 21/00* (2006.01)
*H01J 37/305* (2006.01)

(52) U.S. Cl. .............................. 250/492.3; 250/492.21; 250/311

(58) Field of Classification Search .................... None
See application file for complete search history.

(56) References Cited

U.S. PATENT DOCUMENTS

2005/0184252 A1*    8/2005    Ogawa et al.    ........... 250/492.3

* cited by examiner

*Primary Examiner*—Nikita Wells
(74) *Attorney, Agent, or Firm*—Adams & Wilks

(57) ABSTRACT

A composite system of a scanning electron microscope (SEM) and a focused ion beam apparatus (FIB) has an FIB lens barrel for irradiating a focused ion beam to an irradiating position on a sample surface and an SEM lens barrel for observing a machining state of the machined sample surface. The FIB lens barrel has an aperture defining at least one slit of a preselected pattern so that during irradiation of the sample surface with the focused ion beam, the aperture is irradiated by the focused ion beam with a width covering the slit to thereby machine the sample surface in the form of the preselected pattern of the slit.

20 Claims, 5 Drawing Sheets

A: FOCUSING MODE  B: TRANSFER MODE

COMPOSITE SYSTEM OF SCANNING ELECTRON MICROSCOPE AND FOCUSED ION BEAM

BACKGROUND OF THE INVENTION

1. Field of the Invention

The present invention relates to a composite system (hereinafter "complex apparatus" that can observe a sample with a scanning electron microscope (SEM) on a real time basis while machining the sample with a focused ion beam apparatus (FIB).

2. Background Information

There has already been publicly known a so-called complex FIB system that is provided with an electron lens-barrel separately to have an observation function by an SEM in order to observe a machining state of a sample in applying etching and CVD to the sample with an FIB apparatus. In addition to functions for performing the etching and the CVD, the FIB apparatus includes a function as an ion microscope for detecting a secondary charged particle such as an electron or an ion emitted from a sample surface by ion irradiation and forming an amount of the detection as an image in association with an irradiation position. In response to needs for an observation of a sectional structure at a desired point of a semiconductor wafer, an LSI device, or the like, a conventional FIB apparatus has been used in a form of drilling a sample from a position above a sample surface with etching by FIB irradiation and inclining a sample stage to observe a cross-section of the sample. However, in this case, work of machining and observing a state of the machining has to be carried out repeatedly. Since an irradiation angle of an FIB has to be changed for the machining and the observation, the sample stage has to be moved every time the machining and the observation are performed. Therefore, there has been proposed a system in which two lens-barrels are arranged at different angles with respect to a sample surface to perform machining with one lens-barrel and perform a microscope observation with the other lens-barrel such that the processing and the microscope observation are performed by different beam irradiations. As a basic structure of the system, as shown in FIG. 10, an FIB lens-barrel and an SEM lens-barrel are fixed to a sample stage in an evacuated chamber at different angles, blanking electrodes 1a, 10a for switching and controlling beam irradiation are provided in the respective lens-barrels, and a secondary electron detector is set near the sample stage. For example, a section machining observation apparatus described in JP-A-2-123749 has an object of solving problems in that operation is troublesome because the apparatus has to be moved between a machining angle (usually, horizontal) and an observation angle (about 45 to60 degrees) several times, mechanical error involved in movement of a sample occurs, and it is likely that a very small foreign matter or an abnormal shape is overlooked because a section cannot be seen during machining. In order to solve the problems, the apparatus of the invention described in JP-A-2-123749 includes an ion beam irradiation system and an electron beam irradiation system that irradiate beams on a sample surface to scan the sample surface, a detector that captures a secondary electron emitted from the sample at the time of irradiation of the respective beams, an image display device that displays an output of the detector, and a beam switch. The ion beam irradiation system and the electron beam irradiation system are arranged at an angle of 90 degrees or an angle narrower than 90 degrees from each other in irradiation axes thereof and are mounted in an identical sample chamber such that an ion beam and an electro beam can be irradiated at an identical point on the sample to scan the sample. The beam switch alternately switches the ion beam and the electron beam, and the image display device displays outputs of the detector as a sample surface image and a section machining image according to a switching operation of the switch.

According to the complex FIB system described above, since it is unnecessary to perform inclined movement of the sample stage at the time of machining and at the time of a microscope observation, the complex FIB system is advantageous in terms of trouble of operation and a mechanical error involved in the movement of a sample in the past. However, when it is attempted to perform a cross-section observation with the SEM simultaneously during machining by the FIB, a secondary electron involved in the FIB irradiation is mixed in an SEM detection signal and becomes noise. In this phenomenon, for example, when it is attempted to drill a rectangular hole with FIB etching to observe a cross-section, the FIB is used to scan a rectangular area of the sample in a raster shape to machine the rectangular area. A secondary electron emitted from a sample surface by the beam irradiation is detected by the secondary electron detector. A signal waveform of this secondary electron changes according to a beam irradiation position as indicated as an FIB signal in FIG. 9. In addition, a secondary electron detection signal involved in the electron beam irradiation, which an operator desires to detect as a microscope image, is indicated as an SEM signal in the figure. However, when it is attempted to perform an SEM observation in parallel at the time of the FIB machining, the FIB signal and the SEM signal are superimposed to be a secondary electron detection signal. The secondary electron detection signal changes as indicated as a signal at the time of FIG/SEM simultaneous irradiation in the figure, and an image is disturbed by noise.

A problem that the invention is to solve resides in providing a system including an FIB lens barrel and an SEM lens-barrel in which, when a process of executing FIB machining is observed by an SEM on a real time basis, a secondary electron emitted by FIB irradiation does not form noise for an SEM detection signal.

SUMMARY OF THE INVENTION

The invention provides a composite system (hereinafter "complex apparatus") including an FIB lens-barrel and an SEM lens-barrel, in which a slit of a machining shape is provided in an aperture for FIB, whereby ion beam machining is performed by transferring a pattern onto a sample surface rather than scanning by a focused ion beam.

In addition, the complex apparatus including an FIB lens-barrel and an SEM lens-barrel of the invention includes slits of plural machining pattern shapes and a switching unit for switching the plural machining patterns in the aperture for FIB to thereby make it possible to perform various kinds of machining by selecting or combining the machining patterns.

An ion beam machining method of the invention using a complex apparatus including an FIB lens-barrel, which has an aperture with a slit formed in a machining shape, and an SEM lens-barrel includes: a step of detecting a machining position according to a scanning ion microscopy image (SIM image of) focused ion beam scanning; a step of switching an ion optical system from a focusing mode to a transfer mode; and a step of transferring a pattern of the slit to the detected machining position and machining the pattern.

An ion beam machining method of the invention using a complex apparatus including an FIB lens-barrel, which has an aperture with a slit formed in a machining shape, and an SEM lens-barrel includes: a step of detecting machining position according to a scanning electron microscopy image (SEM image) of electron beam scanning; and a step of transferring a pattern of the slit with ion beam irradiation to the detected machining position.

Further, in the ion beam machining method of the invention, a protective film is formed by electron beam CVD before the step of transferring and machining a pattern with ion beam irradiation.

Moreover, in the ion beam machining method of the invention, a machining end point is detected by observing the machining for transferring a pattern of the slit with ion beam irradiation on a machining position using an SEM.

In a complex apparatus of the invention including an FIB lens-barrel, which has an aperture with a slit formed in a machining shape, an SEM lens-barrel, and a secondary electron detector, an electric filter is arranged on an output side of the secondary electron detector, whereby a noise component due to an FIB is removed from a detected SEM signal.

In a complex apparatus of the invention including an FIB lens-barrel, which has an aperture with a slit formed in a machining shape, an SEM lens-barrel, and a secondary electron detector, a level adjusting circuit is provided on an output side of the secondary electron detector to make it possible to adjust a level according to an operation state of the apparatus.

The invention is the complex apparatus including an FIB lens-barrel and an SEM lens-barrel, in which the slit of a machining shape is provided in the aperture for FIB, whereby ion beam machining is performed by transferring a pattern onto a sample surface rather than scanning by a focused ion beam. Thus, an FIB noise superimposed on an SEM detection signal changes to a background noise uniform for a machining area and never disturbs an image.

In addition, the complex apparatus including an FIB lens-barrel and an SEM lens-barrel of the invention includes slits of plural machining pattern shapes and a switching unit for switching the plural machining patterns in the aperture for FIB to thereby make it possible to perform various kinds of machining by selecting or combining the machining patterns without replacing and attaching a slit.

The ion beam machining method of the invention using a complex apparatus including an FIB lens-barrel, which has an aperture with a slit formed in a machining shape, and an SEM lens-barrel includes: a step of detecting a machining position according to an SIM image of focused ion beam scanning; a step of switching an ion optical system from a focusing mode to a transfer mode; and a step of transferring a pattern of the slit to the detected machining position and machining the pattern. Thus, it is possible to execute a series of work including the detection of a position, the mode switching by the ion optical system, and the transfer and machining of a pattern in order smoothly without moving a sample stage and perform an SEM observation at the time of machining on a real time basis. Consequently, it is possible to improve stability and efficiency of the work.

In addition, in the ion beam machining method including a step of detecting a machining position according to an SEM image of electron beam scanning and a step of transferring a pattern of the slit with ion beam irradiation to the detected machining position, it is also possible to execute the series of work in order smoothly without moving a sample stage and perform an SEM observation at the time of machining on a real time basis. Consequently, it is possible to improve stability and efficiency of the work.

Further, the ion beam machining method of the invention, in which a protective film is formed by electron beam CVD before the step of transferring and machining a pattern with ion beam irradiation, uses irradiation of an electron beam unlike the conventional FIB-CVD. Thus, an irradiated ion of gallium or the like is never implanted in a sample to damage the sample.

Moreover, the ion beam machining method of the invention can observe the machining for transferring a pattern of the slit with ion beam irradiation on a machining position using an SEM. Thus, it is possible to find a very small foreign matter during the machining and detect a machining end point without staggering timing.

The complex apparatus of the invention including an FIB lens-barrel, which has an aperture with a slit formed in a machining shape, an SEM lens-barrel, and a secondary electron detector adopts a structure in which an electric filter is arranged on an output side of the secondary electron detector. Thus, it is possible to remove a noise component due to an FIB from detected SEM signal accurately.

In addition, the complex apparatus of the invention including an FIB lens-barrel, which has an aperture with a slit formed in a machining shape, an SEM lens-barrel, and a secondary electron detector is provided with a level adjusting circuit on an output side of the secondary electron detector. Thus, it is made possible to adjust a signal level accurately according to an operation state of the apparatus.

DETAILED DESCRIPTION OF THE PREFERRED EMBODIMENTS

To meet a demand for observing on a real time basis a state in which FIB machining is performed, the invention was started with development of technique for preventing secondary charged particle emitted by an FIB used for machining from generating noise affecting an SEM detections signal. If an FIB and an electron beam are irradiated on a sample surface simultaneously, emission of secondary electrons by the FIB and the electron beam is an unavoidable phenomenon, and it is difficult to distinguish and detect the secondary electrons. The inventors observed that an FIB signal generated noise for an SEM signal and paid attention to the fact that a signal level of the FIB signal changes in association with raster scanning. On the basis of this fact, the inventors have achieved the idea of performing etching by an unfocused uniform ion beam over an entire machining area rather than using an FIB for raster scanning to perform etching locally in order as in the past. By adopting such a machining method, since noise fluctuating in association with beam scanning is eliminated and a uniform background noise is superimposed on an SEM signal an image is not disturbed.

Figure 1:
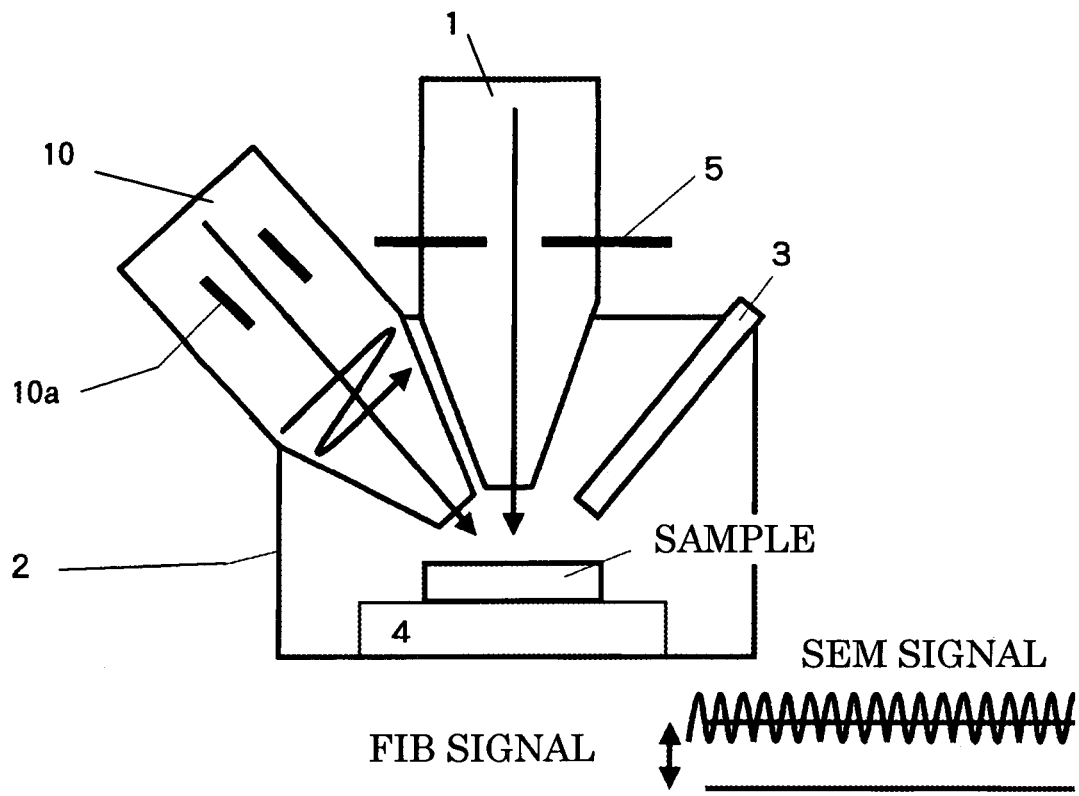
FIG. 1 is a diagram showing a basic structure of a complex apparatus of the invention.
Figure 2:
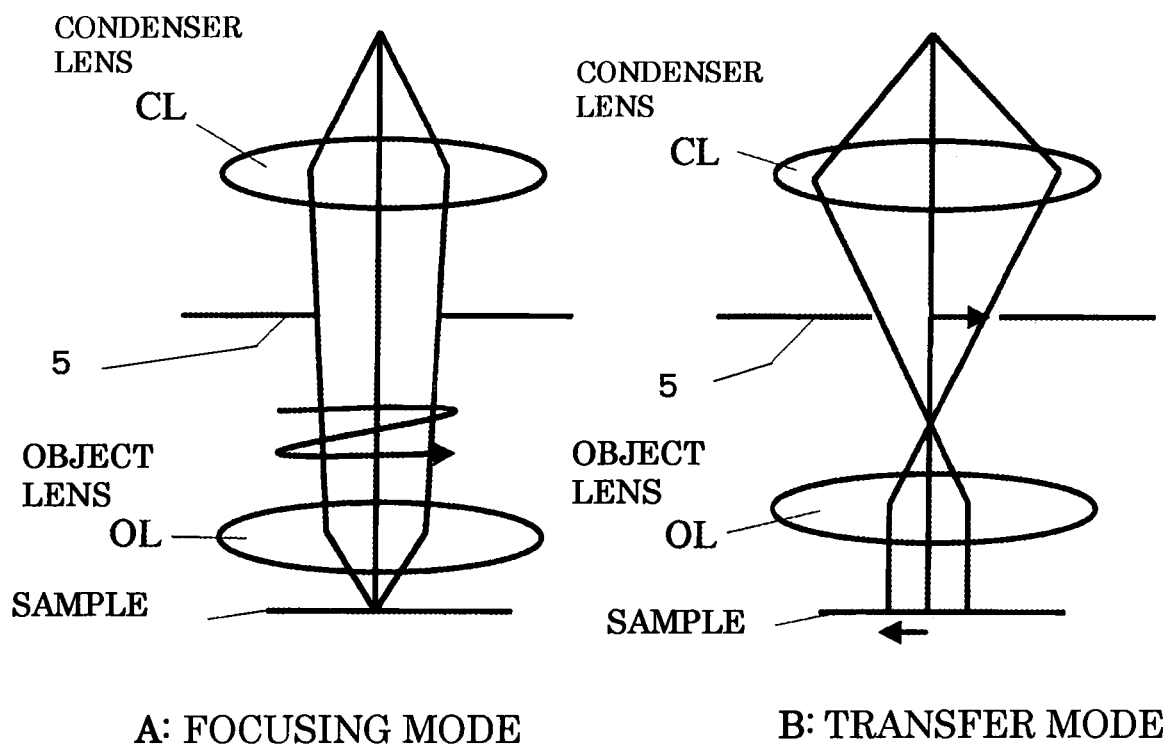
FIG. 2 is a diagram explaining forms of different modes of an FIB lens-barrel in the invention.

FIG. 1 shows a basic structure of the composite apparatus of the invention. Reference numeral 1 denotes an FIB lens-barrel and 10 denotes an SEM lens-barrel. Reference numeral 2 denotes a vacuum chamber; 3, a secondary electron detector; 4, a stage on which a sample is placed; and 10a, a blanking elecotrode of the SEM lens-barrel. FIG. 2 shows a form of switching a focusing mode in which an ion beam is focused and spot-irradiated on a sample surface, as shown in A of FIG. 2, and a transfer mode in which a beam diameter is expanded and made parallel to transfer a pattern onto a sample surface by switching and adjusting a lens system of the FIB lens-barrel, as shown in B of FIG. 2. In this example, an aperture 5 having a slit of a machining shape is arranged between a condenser lens CL and an object lens OL. For example, to meet a demand for observing a sectional state of a specific point of a semiconductor wafer, the aperture 5 with a rectangular pattern slit is arranged as shown in the figure in machining for drilling a hole, when the FIB lens-barrel 1 is actuated as the transfer mode, an ion beam of a uniform level is irradiated on a rectangular area on the sample surface, and a transfer pattern is etched simultaneously and in parallel rather than locally. The SEM lens-barrel 10 functions as a microscope, and a state at this point can be observed on a real time basis. A secondary electron emitted by the ion beam is mixed in an SEM detection signal at that point. However, since an irradiation position of the ion beam does not change, as shown in the figure, the FIB signal is only superimposed on the SEM signal as a direct current signal and never disturbs an alternate current signal. Note that, although the example in which the aperture for transferring a machining pattern is arranged between the condenser lens CL and the object lens OL is described, the aperture may be arranged in a mask form between the object lens OL and the sample surface.

Figure 3:
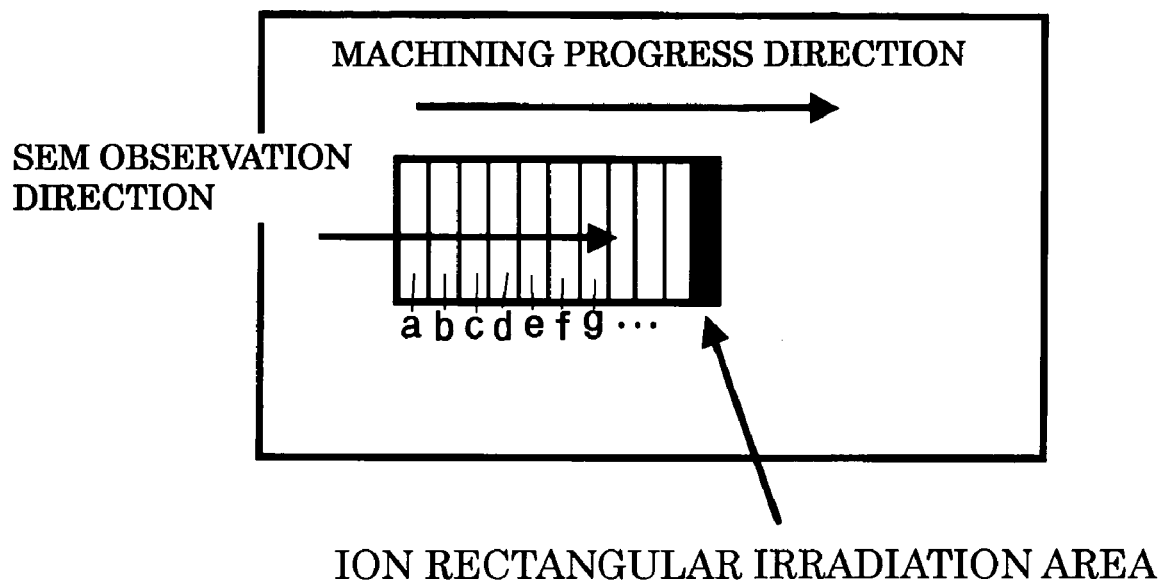
FIG. 3 is a diagram explaining a procedure of executing drilling for cross-section observation by the complex apparatus of the invention.

Although the drilling is explained as a method of uniformly machining a rectangular area, since an optical axis of the SEM lens-barrel 10 is irradiated with an inclination with respect to an observed section, it is unnecessary to drill a hole deeply in a position apart from the sectional position unlike a position near the section. Since the FIB etching is time-consuming work, in the invention, it is possible to adopt a machining method as described below taking into account efficiency of work. FIG. 3 shows a diagram of a sample to be machined viewed from the FIB lens-barrel 1 side. An optical axis of the FIB lens-barrel. 1 is in a direction perpendicular to a paper surface in this figure, and an ion beam is irradiated from a position in an upper part on the paper surface. Therefore, the etching is carried out from front side to a rear side direction of the figure. On the other hand, the optical axis of the SEM lens-barrel 10 is in an inclined direction of a lateral direction with respect to the figure, and an electron beam is irradiated on a sectional portion from a position in an obliquely upper left part of the paper surface. Under such a state, although the drilling is necessary for a left side area with respect to the observed section, shallower machining is sufficient as a portion to be machined is further apart from the observed section to the left taking into account a route of the electron beam. Thus, here, using an aperture of a narrow slit shape, first, ion beam strip pattern irradiation is applied to a position area "a" most distant from the observed section to etch a shallow hole. Next, an ion beam transfer area is moved to an adjacent area "b" on the right side to execute the etching. Processing time in that case is set slightly longer to apply slightly deep machining. Subsequently, a transfer area is gradually moved to the right and subjected to deep drilling, and finally, the specified observed section is machined. During that period, although the SEM observation is performed simultaneously in parallel, the electron beam is used for scanning for a strip area on which the ion beam is irradiated in FIG. 3 and an exposed right side sectional wall to display an SEM image in which a machining state is shown. Since the ion beam is irradiated from a paper surface front side direction in the figure, the ion beam changes to a uniform background for the strip area in this SEM and never becomes noise. If the machining of the invention is performed in this way, it is possible to reduce machining time compared with the drilling of a uniform depth described above.

Next, an overall method of the invention for performing ion beam machining using a complex apparatus including an FIB lens-barrel and an SEM lens-barrel, which further includes a slit of a machining shape in an aperture for FIB, will be explained. First, a position where machining should be applied to a large sample body is specified by a microscope observation. This microscope observation is performed by setting the FIB lens-barrel 1 to the focusing mode and obtaining an SIM image. Concerning the damage to a sample surface due to FIB irradiation, since a still image is simply obtained, it is sufficient to perform scanning only once and it is unnecessary to repeat the scanning as at the time of machining. Thus, concern about the damage is also little. Alternatively, a microscope image of a position to which this machining should be applied can be obtained with the SEM image, and it is possible to perform positioning without damage.

When detection of a position is completed, information on the position is stored in a memory, and a protective film is deposited near the position. Conventionally, the deposition of a protective film has been performed by FIB-CVD. However, an FIB is irradiated on a sample surface repeatedly. Thus, the deposition is not preferable because an ion of gallium or the like is implanted in the sample or the deposition involves etching. The SEM lens-barrel 10 is set in the complex apparatus in accordance with the invention. Thus, it is preferable to form this protective film according to CVD by an electron beam because there is no likelihood of damage. When the protective film is formed, etching by anion beam is performed. An aperture of a slit pattern corresponding to a machining area, which is necessary at that point, is selected, and an irradiation area of the ion beam is positioned according to the detection position information. As the positioning, an observed position may be machined directly or, when machining depth is different, positioning may be performed from a shallow area to carry out machining as described above. At the time of machining by ion beam irradiation, the SEM observation is performed in parallel, and a machining state is confirmed sequentially. Since it is possible to confirm with this SEM observation that the necessary machining has been performed, the machining is finished when this is confirmed.

[First Embodiment]

Figure 4:
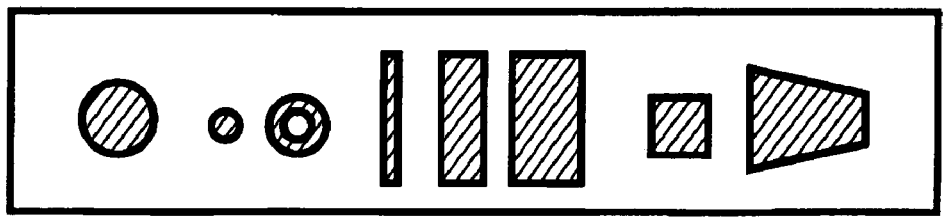
FIG. 4 is a diagram showing an embodiment of an aperture adopted in the complex apparatus of the invention.

FIG. 4 shows an embodiment of an aperture that is used in the complex apparatus of the invention. In the embodiment shown here, opening patterns are a large circle, a small circle, a ring, rectangles with small, medium, and large widths, a square, and a trapezoid. It is needless to mention that patterns are not limited to these and can be created appropriately. In use, when a pattern matches a machining area, the pattern only has to be selected and used. Alternatively, it is also possible to combine several patterns to create a necessary machining pattern. In the latter case, patterns to be combined only have to be selected in order to carry out machining. All the cases are the same in that an area is uniformly irradiated by an FIB rather than scanning the area with the FIB to form a machining pattern. Thus, the FIB simply becomes a uniform background noise for an SEM signal in the machining area,

[Second Embodiment]

Figure 5:
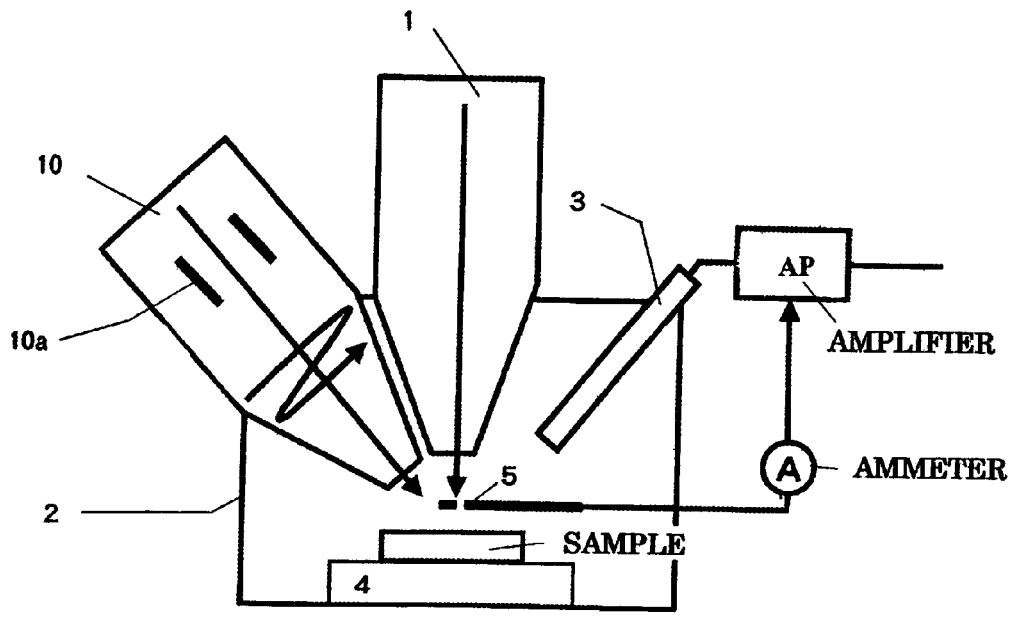
FIG. 5 is a diagram showing an embodiment of the complex apparatus of the invention having a function of removing a background noise according to level adjustment.

Next, FIG. 5 shows an embodiment including means for removing a uniform background noise due to ion beam irradiation from an SEM signal in which the background noise is detected. In view of the fact that this background noise is superimposed on the SEM signal as a bias component corresponding to a beam current of an FIB, the inventors have achieved an idea of detecting the beam current of the FIB and correct the beam current. For this beam current detection, it is advantageous to arrange the aperture 5 of a transfer pattern determining a machining are a between the object lens OL and a sample surface in a mask form. By forming this mask with a conductive material, it is possible to use the aperture 5 also as a beam current detector. In other words, as shown in FIG. 5, the aperture 5 arranged in the mask form between the object lens OL, which is arranged on a tip side of the FIB lens-barrel 1, and the sample surface is used as a detection electrode to pick up a blocked ion beam around an opening of the aperture 5 and detect a beam current with an ammeter A. This value is sent to an amplifier AP, which is connected to an output side of the secondary electron detector 3, as an adjusting signal via a not-shown controller to correct a level of the background noise.

Figure 6:
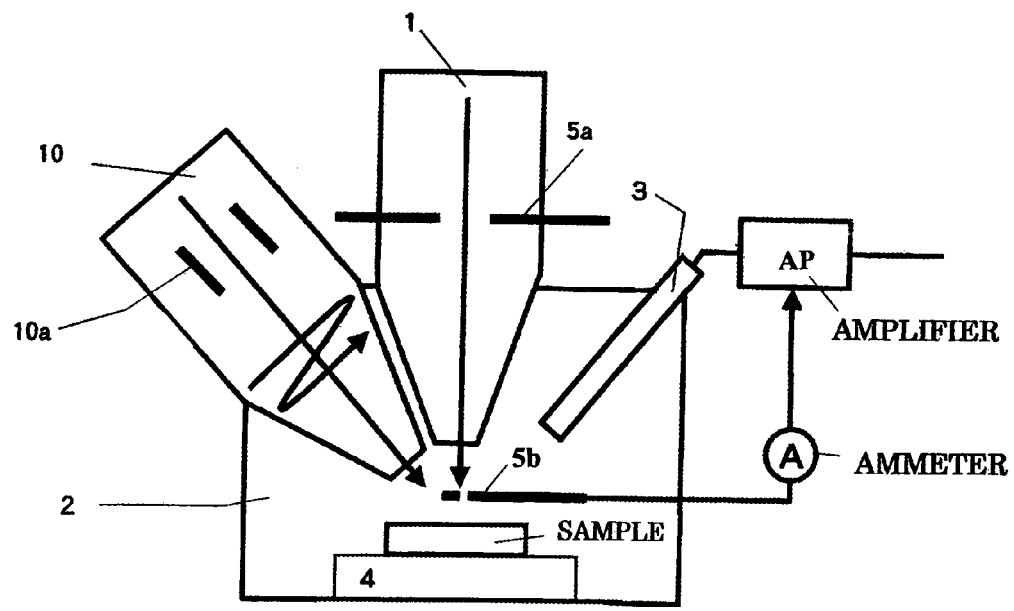
FIG. 6 is a diagram showing a modification of the complex apparatus of the invention having a function of removing a background noise according to level adjustment.

Next, FIG. 6 shows a modification of the embodiment including means for removing a uniform background noise due to ion beam irradiation from an SEM signal in which the background noise is detected. This embodiment adopts a structure shown in FIG. 6, in which another aperture 5a including a slit of an arbitrary shape is separately arranged between the condenser lens CL and the object lens OL. The aperture 5b of a mask formed near a sample functions as a detector for a beam current to apply level adjustment according to a detection value to an amplifier as in the embodiment described above for FIG. 5. This modification is characterized in that the two apertures 5a and 5b are arranged. This has an additional advantage in that various machining patterns can be realized by combining opening patterns of the two apertures.

[Third Embodiment]

Figure 7:
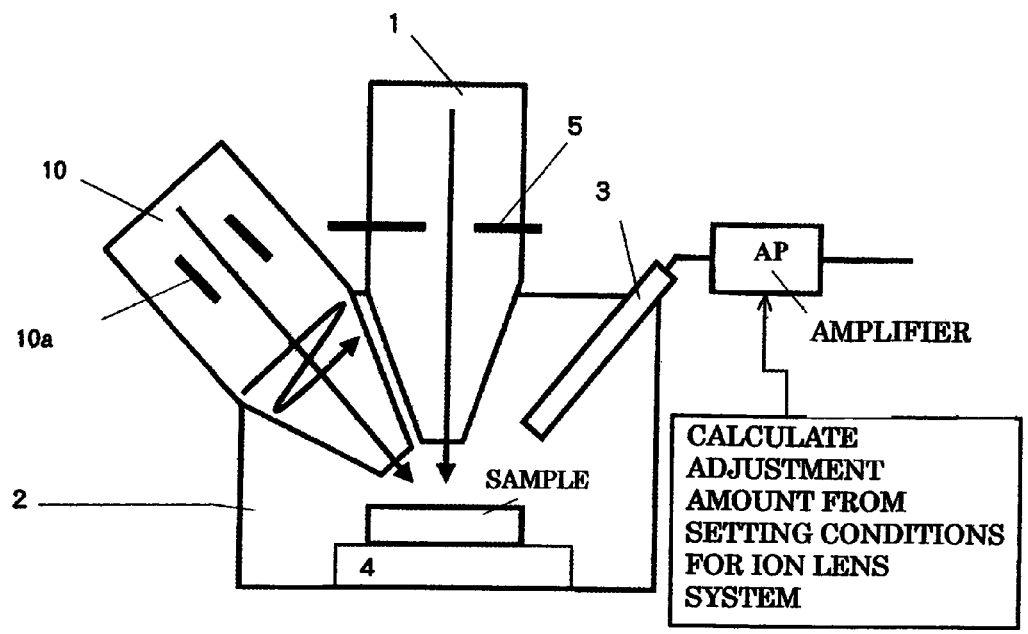
FIG. 7 is diagram showing another embodiment of the complex apparatus of the invention having a function of removing a background noise according to level adjustment.

Next, FIG. 7 shows another embodiment including means for removing a uniform background noise due to ion beam irradiation from an SEM signal in which the background noise is detected. In the embodiment described above, a beam current of an FIB, which causes this background noise, is detected and corrected. However, in this embodiment, in view of the fact that a beam current of an FIB is measured in advance and can be allocated to setting conditions for a lens optical system of an FIB apparatus, the inventors have achieved an idea of performing level adjustment based on the setting conditions for the lens optical system without measuring a beam current directly. As shown in FIG. 7, in this embodiment, it is unnecessary to provide a special component. A beam current is calculated from the setting conditions for the lens optical system in a controller and a background noise level based on this beam current is further calculated to perform correction for the background noise level in the amplifier AP arranged on an output side of the secondary electron detector 3.

[Fourth Embodiment]

Figure 8:
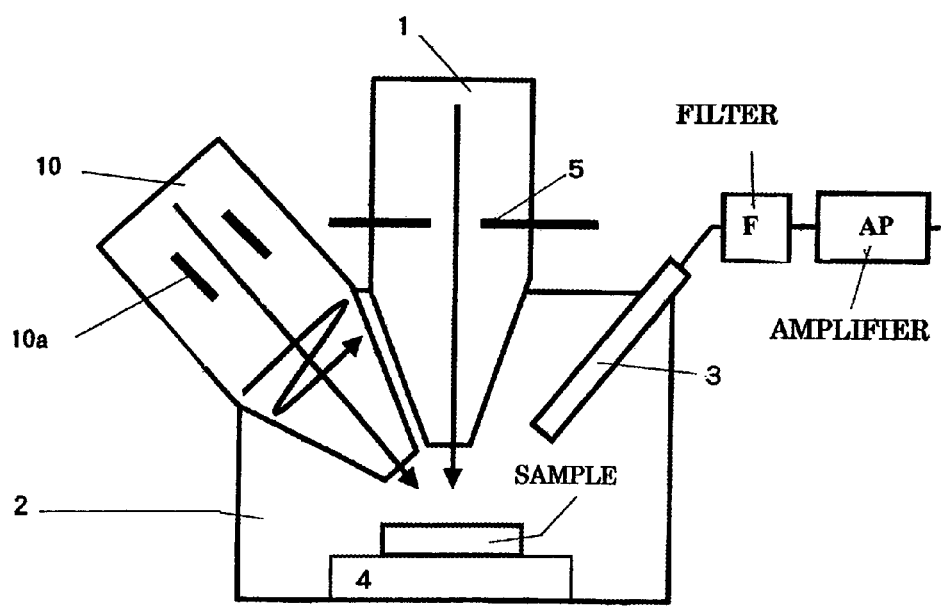
FIG. 8 is a diagram showing an embodiment of the complex apparatus of the invention having a function of removing a background noise with a filter.
Figure 9:
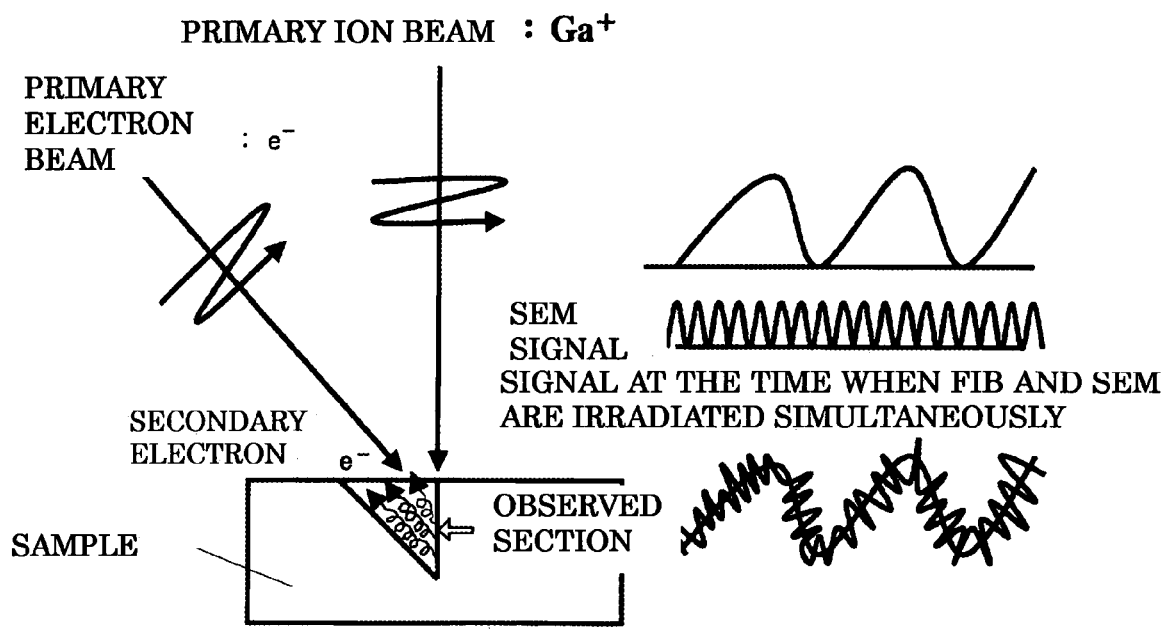
FIG. 9 is a diagram explaining FIB machining and an operation for obtaining an SEM microscope image in an FIB-SEM complex apparatus.
Figure 10:
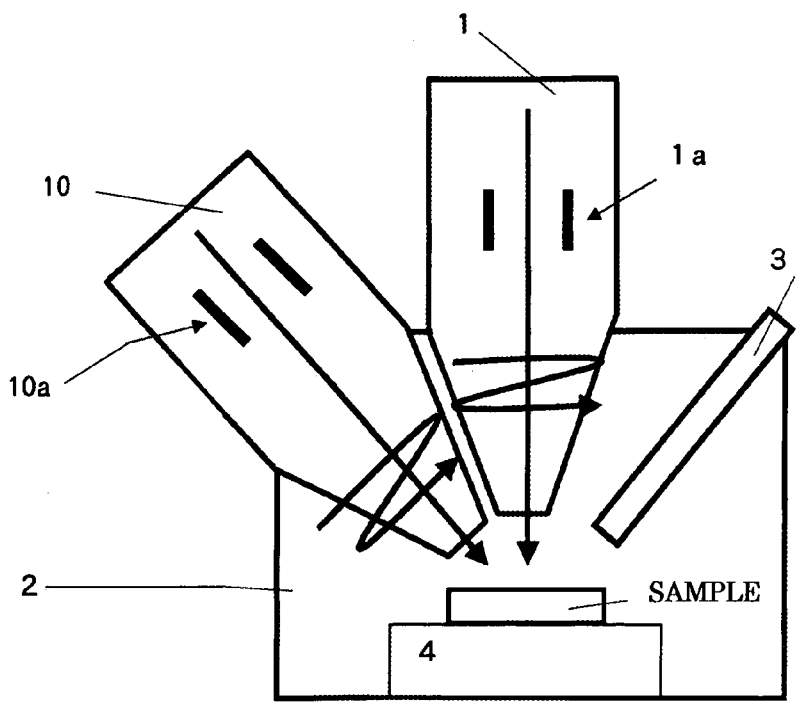
FIG. 10 is a diagram showing a basic structure of a conventional FIB-SEM complex apparatus.

Lastly, FIG. 8 shows an embodiment in which this background noise is cut by a filter. Since an SEM signal, which an operator desires to detect with the secondary electron detector 3, is involved in scanning of an observed area in a raster shape by an electron beam, the SEM signal is affected by distance between an electron beam irradiation position and the secondary electron detector 3. Therefore, basically, a level fluctuation involved in the raster scanning appears in the SEM signal, in which an amount of secondary electron from a sample surface is superimposed on the fluctuation. Therefore, the SEM signal has a frequency component of horizontal scanning, and an FIB noise is a bias signal of a fixed level as described above. Paying attention to this fact, in this embodiment, the inventors have achieved a system for arranging a filter on the output side of the secondary electron detector 3 to cut a direct current component. As shown in FIG. 8, the inventors have realized this system by arranging a filter F, which passes an alternate current component and cuts a direct current component, between an output end of the secondary electron detector 3 and an input end of the amplifier AP.

What is claimed is:

1. A composite system of a scanning electron microscope (SEM) and a focused ion beam apparatus (FIB) comprising: an FIB lens barrel for irradiating a focused ion beam to an irradiating position on a sample surface, the FIB lens barrel having an aperture defining at least one slit of a preselected pattern so that during irradiation of the sample surface with the focused ion beam, the aperture is irradiated by the focused ion beam with a width covering the slit to thereby machine the sample surface in the form of the preselected pattern of the slit; and an SEM lens barrel for observing a machining state of the machined sample surface.

2. A composite system according to claim 1; wherein the at least one slit defined by the aperture of the FIB lens barrel comprises a plurality of slits having different preselected patterns; and further comprising a switching unit for switching between the slits by selecting one of the slits or a combination of the slits to thereby machine the sample surface in the form of the preselected pattern of a selected one of the slits or a preselected pattern resulting from the selection of a combination of the slits.

3. An ion beam machining method comprising the steps of: providing a composite system comprised of a focused ion beam lens barrel for irradiating a focused ion beam and a scanning electron lens barrel for irradiating an electron beam, the focused ion beam lens barrel having an ion optical system operable in a focusing mode and in a transfer mode and an aperture defining at least one slit of a preselected pattern; detecting a machining position on a sample surface by setting the ion optical system of the focused ion beam lens barrel to the focusing mode and scanning the sample surface with a focused ion beam from the focused ion beam lens barrel to obtain a scanning ion microscopy image; switching the ion optical system of the of the focused ion beam lens from the focusing mode to the transfer mode; and transferring the preselected pattern of the aperture slit of the focused ion beam lens barrel to the detected machining position on the sample surface and machining the preselected pattern on the sample surface by irradiating the aperture with a focused ion beam from the focused ion beam lens barrel.

4. An ion beam machining method according to claim 3; further comprising the step of forming a protective film near the detected machining position of the sample surface by electron beam CVD before the step of transferring and machining the preselected pattern.

5. An ion beam machining method according to claim 3; further comprising the step of detecting a termination of the machining step by simultaneously observing a machining state of the machined sample surface using the scanning electron lens barrel during the transferring and machining step.

6. An ion beam machining method comprising the steps of: providing a composite system comprised of a focused ion beam lens barrel for irradiating a focused ion beam and a scanning electron lens barrel for irradiating an electron beam, the focused ion beam lens barrel having an ion optical system operable in a focusing mode and in a transfer mode and an aperture defining at least one slit of a preselected pattern; detecting a machining position on a sample surface by scanning the sample surface with an electron beam from the scanning electron lens barrel to obtain a scanning electron microscopy image; and transferring the preselected pattern of the aperture slit of the scanning electron lens barrel to the detected machining position on the sample surface and machining the preselected pattern on the sample surface by irradiating the aperture with a focused ion beam from the scanning electron lens barrel.

7. A composite system of a scanning electron microscope (SEM) and a focused ion beam apparatus (FIB) comprising: an FIB lens barrel for irradiating a focused ion beam to an irradiating position on a sample surface, the FIB lens barrel having an aperture defining at least one slit having a preselected pattern so that during irradiation of the sample surface with the focused ion beam, the aperture is irradiated by the focused ion beam to thereby machine the sample surface in the form of the preselected pattern of the slit; an SEM lens barrel for observing a machining state of the machined sample surface; and a secondary electron detector for detecting an SEM signal; and an electric filter arranged on an output side of the secondary electron detector for removing from a detected SEM signal noise resulting from a direct current component generated during irradiation of the sample surface with the focused ion beam.

8. A composite system of a scanning electron microscope (SEM) and a focused ion beam apparatus (FIB) comprising: an FIB lens barrel for irradiating a focused ion beam to an irradiating position on a sample surface, the FIB lens barrel having an aperture defining at least one slit having a preselected pattern so that during irradiation of the sample surface with the focused ion beam, the aperture is irradiated by the focused ion beam to thereby machine the sample surface in the form of the preselected pattern of the slit; an SEM lens barrel for observing a machining state of the machined sample surface; a secondary electron detector for detecting an SEM signal; an ion beam current detector for detecting an ion beam current of the focused ion beam irradiated by the FIB lens barrel; and a level adjusting circuit disposed on a output side of the secondary electron detector for adjusting a level of a background noise generated by the ion beam current detected by the ion beam current detector.

9. A composite system of a scanning electron microscope (SEM) and a focused ion beam apparatus (FIB) comprising: an FIB lens barrel for irradiating a focused ion beam to an irradiating position on a sample surface, the FIB lens barrel having an aperture defining at least one slit having a preselected pattern so that during irradiation of the sample surface with the focused ion beam, the aperture is irradiated by the focused ion beam to thereby machine the sample surface in the form of the preselected pattern of the slit; an SEM lens barrel for observing a machining state of the machined sample surface; a secondary electron detector for detecting an SEM signal; a calculating unit for calculating an ion beam current of the focused ion beam irradiated by the FIB lens barrel and a noise level resulting from the ion beam current in accordance with setting conditions for an ion lens system of the FIB lens barrel; and a noise level adjusting circuit disposed on an output side of the secondary electron detector for adjusting the noise level in accordance with a calculation result from the calculating unit.

10. A composite system of a scanning electron microscope (SEM) and a focused ion beam apparatus (FIB) comprising:
an FIB lens barrel for irradiating a focused ion beam to an irradiating position on a sample surface;
means defining at least one slit having a preselected pattern disposed in the path of an optical axis of the focused ion beam irradiated by the FIB lens barrel so that during irradiation of the sample surface with the focused ion beam, the irradiating position on the sample surface is machined by the focused ion beam with the preselected pattern of the slit; and
an SEM lens barrel for observing a machining state of the machined sample surface.

11. A composite system according to claim 10; wherein the SEM lens barrel includes means for irradiating an electron beam to the irradiating position on the sample surface simultaneously with the irradiation of the sample surface with the focused ion beam for observing a machining state of the machined sample surface.

12. A composite system according to claim 10; further comprising a sample chamber having a stage for supporting the sample; and wherein the FIB lens barrel and the SEM lens barrel are disposed in the sample chamber.

13. A composite system according to claim 10; wherein the at least one slit comprises a plurality of slits having different preselected patterns; and further comprising a switching unit for switching between the slits by selecting one of the slits or a combination of the slits to thereby machine the sample surface in the form of the preselected pattern of a selected one of the slits or a preselected pattern resulting from the selection of a combination of the slits.

14. A composite system according to claim 10; wherein the FIB lens barrel has a condenser lens and an object lens; and wherein the means defining at least one slit having a preselected pattern comprises an aperture of the FIB lens barrel disposed between the condenser lens and the object lens.

15. A composite system according to claim 10; wherein the FIB lens barrel has an object lens at a tip thereof; and wherein the means defining at least one slit is disposed between the sample surface and the object lens of the FIB lens barrel.

16. A composite system according to claim 10; further comprising a secondary electron detector for detecting an SEM signal, an ion beam current detector for detecting an ion beam current of the focused ion beam irradiated by the FIB lens barrel, and a level adjusting circuit disposed on a output side of the secondary electron detector for adjusting a level of a background noise generated by the ion beam current detected by the ion beam current detector.

17. A composite system according to claim 10; further comprising a secondary electron detector for detecting an SEM signal and an electric filter arranged on an output side of the secondary electron for removing from a detected SEM signal noise resulting from a direct current component generated during irradiation of the sample surface with the focused ion beam.

18. A composite system according to claim 10; further comprising a secondary electron detector for detecting an SEM signal, a calculating unit for calculating an ion beam current of the focused ion beam irradiated by the FIB lens barrel and a noise level resulting from the ion beam current in accordance with setting conditions for an ion lens system of the FIB lens barrel, and a level adjusting circuit disposed on an output side of the secondary electron detector for adjusting the noise level in accordance with a calculation result from the calculating unit.

19. A composite system according to claim 10; wherein the FIB lens barrel has an object lens disposed at a tip thereof and a condenser lens; and wherein the means defining at least one slit having a preselected pattern comprises a first aperture of the FIB lens barrel having at least one slit with a preselected pattern and disposed between the condenser lens and the object lens, and a second aperture of the FIB lens barrel having at least one slit with a preselected pattern and disposed between the sample surface and the object lens.

20. A composite system according to claim 19; wherein the at least one slit of each aperture comprises a plurality of slits having different preselected patterns; and further comprising a switching unit for switching between the slits of each aperture by selecting one of the slits or a combination of the slits of each aperture to thereby machine the sample surface in the form of the preselected pattern of a selected one of the slits of each aperture or a preselected pattern resulting from the selection of a combination of the slits of each aperture.

* * * * *